United States Patent
Yoshida et al.

(10) Patent No.: US 9,564,558 B2
(45) Date of Patent: Feb. 7, 2017

(54) FLUORIDE FLUORESCENT MATERIAL AND LIGHT EMITTING DEVICE USING THE SAME

(71) Applicant: NICHIA CORPORATION, Anan-shi, Tokushima (JP)

(72) Inventors: Tomokazu Yoshida, Anan (JP); Suguru Takashima, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 65 days.

(21) Appl. No.: 14/446,600

(22) Filed: Jul. 30, 2014

(65) Prior Publication Data

US 2015/0035430 A1 Feb. 5, 2015

(30) Foreign Application Priority Data

Aug. 1, 2013 (JP) ................................ 2013-160835
Apr. 24, 2014 (JP) ................................ 2014-090453

(51) Int. Cl.
 H01L 33/50 (2010.01)
 C09K 11/61 (2006.01)

(52) U.S. Cl.
 CPC ........... *H01L 33/502* (2013.01); *C09K 11/616* (2013.01)

(58) Field of Classification Search
 CPC ...... H01L 33/502; H01L 33/06; C09K 11/675; C09K 11/025; G02F 1/133603
 See application file for complete search history.

(56) References Cited

U.S. PATENT DOCUMENTS

| | | | |
|---|---|---|---|
| 2006/0169998 A1 | 8/2006 | Radkov et al. | |
| 2012/0256125 A1* | 10/2012 | Kaneyoshi | C01B 9/08 252/301.4 F |
| 2012/0267999 A1* | 10/2012 | Sakuta | C09K 11/7739 313/503 |
| 2014/0362885 A1* | 12/2014 | Sakuta | H01L 33/44 372/44.01 |
| 2015/0008463 A1* | 1/2015 | Yoshida | C09K 11/675 257/98 |
| 2015/0055060 A1* | 2/2015 | Yoshida | H05B 33/14 349/70 |

(Continued)

FOREIGN PATENT DOCUMENTS

| | | |
|---|---|---|
| JP | 2009-528429 A | 8/2009 |
| JP | 2009-212508 A | 9/2009 |

(Continued)

OTHER PUBLICATIONS

A. G. Paulusz, Efficient Mn(IV) Emission in Fluorine Coordination, J. Electrochem. Soc.: Solid-State Science and Technology, vol. 120, No. 7, Jul. 1973, p. 942-947.

*Primary Examiner* — Anne Hines
(74) *Attorney, Agent, or Firm* — Andrews Kurth Kenyon LLP

(57) ABSTRACT

The present invention provides a fluoride fluorescent material comprising a chemical composition represented by the following formula (I):

$$K_2[M_{1-a}Mn^{4+}{}_aF_6] \qquad (I)$$

wherein M is at least one element selected from the group consisting of elements belonging to Groups 4 and 14 of the Periodic Table, and a is a value that satisfies the relationship: $0<a<0.2$, and a minimum value of a weight median diameter of the fluoride fluorescent material is 30 μm.

21 Claims, 1 Drawing Sheet

(56) References Cited

U.S. PATENT DOCUMENTS

2015/0061488 A1* 3/2015 Yoshida ............... C09K 11/675
                                                                    313/503

FOREIGN PATENT DOCUMENTS

| JP | 2010-209311 | 9/2010 |
| --- | --- | --- |
| JP | 2010-209311 A | 9/2010 |
| JP | 2010-232381 A | 10/2010 |
| JP | 2012-224536 A | 11/2012 |

* cited by examiner

FLUORIDE FLUORESCENT MATERIAL AND LIGHT EMITTING DEVICE USING THE SAME

CROSS-REFERENCE TO RELATED APPLICATIONS

This application claims priority under 35 USC 119 from Japanese patent Application No. 2013-160835, filed on Aug. 1, 2013 and No. 2014-090453, filed on Apr. 24, 2014, the disclosures of which are incorporated by reference herein.

BACKGROUND OF THE INVENTION

Field of the Invention

The present invention relates to a fluoride fluorescent material and a light emitting device using the same.

Description of the Related Art

A light emitting diode (LED) is a semiconductor light emitting element frequently used as a substitute for a conventional light source, and is useful as a display lamp, a warning lamp, and a lamp for indicator or lighting. Various types of light emitting devices emitting a light of, e.g., a white color, electric bulb color, or orange color have been developed, wherein the devices use a semiconductor light emitting element produced from a Group III-V semiconductor, such as gallium nitride (GaN), and a fluorescent material in combination. These light emitting devices emitting a light of a white color or the like is controlled in color tone by the principle of mixing colors of lights. As a system for emitting a white light, a system using a light emitting element emitting an ultraviolet light and three types of fluorescent materials respectively emitting red (R), green (G), and blue (B) lights, and a system using a light emitting element emitting a blue light and a fluorescent material emitting, e.g., a yellow light have been well known. A light emitting device of a system using a light emitting element emitting a blue light and a fluorescent material emitting, e.g., a yellow light is demanded in a wide variety of fields, such as a lighting, a car lighting, a display, and a backlight for liquid crystal. In these fields, the fluorescent material used in the display application is desired to have both excellent light emission efficiency and excellent intensity of color for reproducing colors in a wide range on the chromaticity coordinates. Further, the fluorescent material used in the display application is desired to be advantageously used in combination with a filter, and thus a fluorescent material exhibiting an emission spectrum having a narrow half band width is demanded.

For example, as a red light-emitting fluorescent material having an excitation band in the blue region, and exhibiting an emission spectrum having a narrow half band width, a fluoride fluorescent material activated by tetravalent manganese ions ($Mn^{4+}$), having a composition, such as $K_2TiF_6$:$Mn^{4+}$, $Ba_2TiF_6$:$Mn^{4+}$, $Na_2TiF_6$:$Mn^{4+}$, or $K_3ZrF_7$:$Mn^{4+}$, has been known (see, for example, Japanese Patent Application prior-to-examination Publication (kohyo) No. 2009-528429). In addition, a fluoride fluorescent material having a composition: $K_2SiF_6$:$Mn^{4+}$ has been known (see, for example, Japanese Unexamined Patent Publication No. 2010-209311). Further, the excitation and emission spectra and the light emission mechanism of a fluoride complex fluorescent material activated by $Mn^{4+}$ have been known (see, for example, "Effective Mn(IV) Emission in Fluoride Coordination", written by A. G. Paulusz, J. Electrochemical Soc., 120 N7, 1973, p. 942-947).

SUMMARY OF THE INVENTION

A present embodiment is a fluoride fluorescent material having a chemical composition represented by the following formula (I):

$$K_2[M_{1-a}Mn^{4+}{}_aF_6] \quad (I)$$

wherein M is at least one element selected from the group consisting of elements belonging to Groups 4 and 14 of the Periodic Table, and a satisfies the relationship: $0<a<0.2$, and a minimum value of a weight median diameter of the fluoride fluorescent material is 30 μm.

The fluoride fluorescent material can provide a red light-emitting fluorescent material having excellent light emission intensity.

DETAILED DESCRIPTION OF THE INVENTION

The $Mn^{4+}$-activated, red light-emitting fluoride fluorescent materials exhibiting an emission peak having a narrow half band width, which are considered advantageous particularly to the application of display, are desired to be brought into practical use. However, the conventional fluoride fluorescent materials have not achieved satisfactory light emission properties in respect of the light emission intensity.

Accordingly, an object of the present invention is to solve the above problems accompanying the conventional arts and to provide a red light-emitting fluorescent material having excellent light emission intensity and a light emitting device using the same.

The present inventors have conducted extensive and intensive studies with a view toward solving the above-mentioned problems. As a result, the present invention has been completed. The present invention involves the following embodiments.

The first embodiment of the present invention is a fluoride fluorescent material having a chemical composition represented by the following formula (I):

$$K_2[M_{1-a}Mn^{4+}{}_aF_6] \quad (I)$$

wherein M is at least one element selected from the group consisting of elements belonging to Groups 4 and 14 of the Periodic Table, and a satisfies the relationship: $0<a<0.2$, and a minimum value of a weight median diameter of the fluoride fluorescent material is 30 μm or more.

The second embodiment of the present invention is a fluoride fluorescent material having a chemical composition represented by the following formula (I):

$$K_2[M_{1-a}Mn^{4+}{}_aF_6] \quad (I)$$

wherein M is at least one element selected from the group consisting of elements belonging to Groups 4 and 14 of the Periodic Table, and a satisfies the relationship: $0<a<0.2$, and the fluoride fluorescent material has a bulk density of 0.80 g/cm³ or more.

The third embodiment of the present invention is a light emitting device comprising: a light source that generates light having a wavelength in the range of from 380 to 485 nm; and the above-mentioned fluoride fluorescent material.

The fourth embodiment of the present invention is an image display apparatus comprising the above-mentioned light emitting device.

The fifth embodiment of the present invention is a method for producing the above-mentioned fluoride fluorescent material, the method comprising mixing together a first solution containing at least first complex ions comprising tetravalent manganese and hydrogen fluoride, a second solution containing at least potassium ions and hydrogen fluoride, and a third solution containing at least second complex ions comprising at least one element selected from the group consisting of elements belonging to Groups 4 and 14 of the Periodic Table and fluorine ions.

According to the present invention, there can be provided a red light-emitting fluorescent material having excellent light emission intensity and a light emitting device using the same.

Hereinbelow, an embodiment of the present invention will be described in detail. The embodiment described below exemplifies the fluoride fluorescent material, method for producing the same, and light emitting device for specifically showing the technical idea of the present embodiment, and the present embodiment is not limited to the following fluoride fluorescent material, method for producing the same, and light emitting device.

The relationship between the color names and the chromaticity coordinates, the relationship between the wavelength ranges of light and the color names of monochromatic light, and others are according to JIS Z8110. Specifically, a wavelength range of 380 to 455 nm corresponds to bluish violet, 455 to 485 nm corresponds to blue, 485 to 495 nm corresponds to bluish green, 495 to 548 nm corresponds to green, 548 to 573 nm corresponds to yellowish green, 573 to 584 nm corresponds to yellow, 584 to 610 nm corresponds to yellowish red, and 610 to 780 nm corresponds to red.

In the present specification, the term "step" means not only an independent step but also a step which cannot be clearly distinguished from the other steps but can achieve the desired object thereof. The range of values expressed using "to" indicates a range which includes the figures shown before and after "to" as, respectively, the minimum value and the maximum value. Further, with respect to the amount of a component contained in the composition, when a plurality of materials are present in the composition as the components of the composition, the amount of the components means the total amount of the materials present in the composition unless otherwise specified.

<Fluoride Fluorescent Material>

The fluoride fluorescent material of the present embodiment has a chemical composition represented by the formula (I) below, and has a weight median diameter of 30 μm or more, that is a minimum value of the weight median diameter of the fluoride fluorescent material is 30 μm.

$$K_2[M_{1-a}Mn^{4+}{}_aF_6] \qquad (I)$$

Wherein M is at least one element selected from the group consisting of elements belonging to Groups 4 and 14 of the Periodic Table, and a is a value that satisfies the relationship: 0<a<0.2.

By virtue of having a chemical composition represented by the formula (I) as a compositional formula and having a weight median diameter of 30 μm or more, the fluoride fluorescent material can exhibit an emission peak having a narrow half band width and have excellent light emission intensity (luminance). When the weight median diameter of the fluoride fluorescent material is less than 30 μm, it is likely that a satisfactory light emission intensity cannot be obtained.

The weight median diameter of the fluoride fluorescent material is 30 μm or more, and, from a viewpoint of achieving excellent light emission intensity, the weight median diameter is preferably 35 μm or more, more preferably more than 40 μm, further preferably more than 50 μm. With respect to a maximum value of the weight median diameter of the fluoride fluorescent material, there is no particular limitation, and, from a viewpoint of the working properties upon mixing the fluorescent material with a resin and the moldability, the maximum value of the weight median diameter is preferably 100 μm or less, more preferably 80 μm or less, further preferably 70 μm or less. In a case the maximum value of the weight median diameter is in the above range, in a production process of a light emitting device, mixing the fluorescent material with a resin and molding the resultant mixture can be easily made. The fluoride fluorescent material having too large a weight median diameter may make it difficult to mix the fluorescent material with a resin and mold the resultant mixture.

In the present embodiment, the "weight median diameter" is defined as follows. The weight median diameter is a value determined from a weight-based particle size distribution curve obtained by the measurement of particle size distribution by a laser diffraction and scattering method. Specifically, the weight median diameter is a value obtained by measuring, with respect to the fluorescent material dispersed in an aqueous solution containing a dispersant, a weight-based particle size distribution in respect of the particle diameter in the range of from 0.1 to 600 μm by a laser diffraction-type particle size distribution measurement apparatus (for example, MASTER SIZER 2000, manufactured by Malvern Instruments Ltd.). In the measured particle size distribution, a weight median diameter (Dm) is determined as a particle diameter corresponding to the 50% cumulative weight from the small diameter side.

With respect to the particle size distribution of the fluoride fluorescent material, there is no particular limitation. From a viewpoint of achieving excellent light emission intensity and durability, the particle size distribution of the fluoride fluorescent material is preferably a particle size distribution having a single peak, more preferably a particle size distribution having a narrow distribution width and having a single peak.

The shape of particle of the fluoride fluorescent material is, for example, preferably a non-flat plate shape, more preferably a rectangular particle shape.

With respect to the average particle diameter of the fluoride fluorescent material as measured by a Fischer method (Fischer Sub-Sieve Sizer: F.S.S.S.), there is no particular limitation. From a viewpoint of achieving excellent light emission intensity and durability, the average particle diameter of the fluoride fluorescent material as measured by a Fischer method is preferably 20 μm or more, more preferably 30 μm or more, further preferably 40 μm or more. The upper limit of the average particle diameter as measured by a Fischer method is preferably 100 μm or less, more preferably 80 μm or less, further preferably 60 μm or less.

The average particle diameter as measured by a Fischer method is, for example, measured using Fisher Sub-Sieve Sizer Model 95, manufactured by Fisher Scientific Inc.

With respect to a bulk density of the fluoride fluorescent material, there is no particular limitation. From a viewpoint of achieving excellent light emission intensity and durability, the bulk density of the fluoride fluorescent material is preferably 0.80 g/cm³ or more, more preferably 0.90 g/cm³ or more, further preferably 1.00 g/cm³ or more. Further, the bulk density of the fluoride fluorescent material is preferably 2.67 g/cm³ or less.

The bulk density is measured by, for example, a general measurement method using a measuring cylinder. The bulk density is described below in detail. Generally, a bulk density of powder is determined by measuring a volume of a powder sample which has a known weight and which is placed in a measuring cylinder, or measuring a weight of a powder sample which has a known volume through a volumeter and which is placed in a container, or using a container for measuring a bulk density. Of these methods, the method using a measuring cylinder is easy and hence preferred.

The method using a measuring cylinder is described below. A sample in a satisfactory amount for the measurement is prepared and, if necessary, passed through a sieve. Then, a required amount of the sample is placed in a dried measuring cylinder having a certain capacity. In this instance, if necessary, the upper surface of the sample is made even. The above operations are gently performed so as not to adversely affect the physical properties of the sample. Then, a volume of the sample is determined by reading the minimum scale of the measuring cylinder, and a weight of the sample per unit volume is calculated to determine a bulk density. It is preferred that the measurement of bulk density is repeatedly performed, and it is more preferred that the measurement of bulk density is performed two or more times and an arithmetic mean of the measured values is determined as a bulk density.

From a viewpoint of achieving excellent light emission intensity, the fluoride fluorescent material preferably has a weight median diameter of 30 μm or more and a bulk density of 0.80 g/cm³ or more, more preferably has a weight median diameter of 35 μm or more and a bulk density of 0.90 g/cm³ or more, further preferably has a weight median diameter of more than 40 μm and a bulk density of 0.90 g/cm³ or more, especially preferably has a weight median diameter of more than 50 μm and a bulk density of 0.90 g/cm³ or more.

Further, the fluoride fluorescent material of the present invention has a chemical composition represented by the formula (I) below, and has a bulk density of 0.80 g/cm³ or more.

$$K_2[M_{1-a}Mn^{4+}{}_aF_6] \tag{I}$$

Wherein M is at least one element selected from the group consisting of elements belonging to Groups 4 and 14 of the Periodic Table, and a is a value that satisfies the relationship: 0<a<0.2.

By virtue of having a chemical composition represented by the formula (I) as a compositional formula and having a bulk density of 0.80 g/cm³ or more, the fluoride fluorescent material can exhibit an emission peak having a narrow half band width and have excellent light emission intensity (luminance). When the bulk density of the fluoride fluorescent material is less than 0.80 g/cm³, it is likely that a satisfactory light emission intensity cannot be obtained.

The composition of the fluoride fluorescent material is represented by the formula (I). The fluoride fluorescent material is a fluorescent material activated by $Mn^{4+}$, and is capable of emitting a red light by absorbing a light having a wavelength in the short wavelength region of a visible light. The excitation light, which is light having a wavelength in the short wavelength region of a visible light, is preferably mainly a light in the blue region. The excitation light, specifically, has a main peak wavelength for intensity spectrum preferably in the range of from 380 to 500 nm, more preferably in the range of from 380 to 485 nm, further preferably in the range of from 400 to 485 nm, especially preferably in the range of from 440 to 480 nm.

With respect to the emission wavelength of the fluoride fluorescent material, there is no particular limitation as long as the emission wavelength is longer than the wavelength of the excitation light and is in the red region. With respect to the emission spectrum of the fluoride fluorescent material, the peak wavelength is preferably in the range of from 610 to 650 nm. Further, the emission spectrum of the fluoride fluorescent material preferably has a smaller half band width, specifically, preferably has a half band width of 10 nm or less.

In the formula (I), M is at least one element selected from the group consisting of elements belonging to Groups 4 and 14 of the Periodic Table, and, from the viewpoint of achieving excellent light emission properties, it is preferred that M is at least one element selected from the group consisting of titanium (Ti), zirconium (Zr), hafnium (Hf), silicon (Si), germanium (Ge), and tin (Sn), it is more preferred that M comprises silicon (Si), or silicon (Si) and germanium (Ge), and it is further preferred that M is silicon (Si), or silicon (Si) and germanium (Ge).

In a case M comprises silicon (Si), or silicon (Si) and germanium (Ge), portion of at least one of Si and Ge may be substituted with at least one element selected from the group consisting of elements belonging to Group 4 of the Periodic Table including Ti, Zr, and Hf, and elements belonging to Group 14 of the Periodic Table including C and Sn.

The fluoride fluorescent material has a chemical composition represented by the formula (I) above wherein portion of the potassium ions ($K^+$) may be substituted with at least one cation selected from the group consisting of $Li^+$, $Na^+$, $Rb^+$, $Cs^+$, and $NH_4^+$. That is, the fluoride fluorescent material may have a chemical composition represented by the following formula (Ia):

$$A_2[M_{1-a}Mn^{4+}{}_aF_6] \tag{Ia}$$

wherein A is a cation comprising at least $K^+$, and optionally comprising at least one cation selected from the group consisting of $Li^+$, $Na^+$, $Rb^+$, $Cs^+$, and $NH_4^+$, M is at least one element selected from the group consisting of elements belonging to Groups 4 and 14 of the Periodic Table, and a is a value that satisfies the relationship: 0<a<0.2.

The fluoride fluorescent material can be used in, for example, conventionally known light emitting devices. Examples of the conventionally known light emitting devices include lighting apparatuses, such as a fluorescent lamp, display apparatuses, such as a display and a radar, and a backlight for a liquid crystal. The fluoride fluorescent material is especially preferably used in a light emitting device for a display, preferably for a liquid crystal display apparatus.

<Method for Producing the Fluoride Fluorescent Material>

With respect to the method for producing the fluoride fluorescent material, there is no particular limitation. The fluoride fluorescent material can be produced by, for example, a method which comprises a step of mixing together a first solution containing at least first complex ions comprising tetravalent manganese and hydrogen fluoride, a second solution containing at least potassium ions and hydrogen fluoride and a third solution containing at least second complex ions comprising at least one element selected from the group consisting of elements belonging to Groups 4 and 14 of the Periodic Table and fluorine ions.

By mixing together the first solution, second solution and third solution, the fluoride fluorescent material having a desired composition and having a desired weight median diameter can be produced with ease at excellent productivity.

(First Solution)

The first solution (hereinafter, also referred to as "solution A") contains at least the first complex ions comprising tetravalent manganese ions and hydrogen fluoride, and may contain another component if necessary. The first solution is obtained in the form of, for example, an aqueous solution of hydrofluoric acid containing a manganese ion source. With respect to the manganese ion source, there is no particular limitation as long as it is a compound forming tetravalent manganese ions. Specific examples of manganese ion sources which can constitute the first solution include $K_2MnF_6$, $KMnO_4$, and $K_2MnCl_6$. Of these, preferred is $K_2MnF_6$ because, for example, $K_2MnF_6$ does not contain chlorine which is likely to strain the crystal lattice to cause the crystal to be unstable, and $K_2MnF_6$ can be stably present as $MnF_6$ complex ions in hydrofluoric acid while maintaining the oxidation number (tetravalent) which can achieve activation. Among the manganese ion sources, one containing potassium can serve also as a potassium source contained in the second solution.

With respect to the manganese ion source constituting the first solution, a single type may be used, or two or more types may be used in combination.

The lower limit of the hydrogen fluoride concentration of the first solution is, for example, 30% by weight or more, preferably 35% by weight or more, more preferably 40% by weight or more. Further, the upper limit of the hydrogen fluoride concentration of the first solution is, for example, 70% by weight or less, preferably 65% by weight or less, more preferably 60% by weight or less. In a case the hydrogen fluoride concentration is 30% by weight or more, the manganese ion source (for example, $K_2MnF_6$) constituting the first solution is improved in the stability to hydrolysis, so that a change of the tetravalent manganese ion concentration of the first solution is suppressed. Thus, it is likely that the amount of the manganese for activation contained in the obtained fluoride fluorescent material can be easily controlled, making it possible to suppress variation (change) of the light emission efficiency of the fluoride fluorescent material. On the other hand, in a case the hydrogen fluoride concentration is 70% by weight or less, a lowering of the boiling point of the first solution is suppressed, so that the generation of hydrogen fluoride gas is suppressed. Thus, the hydrogen fluoride concentration of the first solution can be easily controlled, making it possible to effectively suppress variation (change) of the particle diameter of the obtained fluoride fluorescent material.

With respect to the concentration of the first complex ions in the first solution, there is no particular limitation. The lower limit of the first complex ion concentration of the first solution is, for example, 0.1% by weight or more, preferably 0.3% by weight or more, more preferably 0.5% by weight or more. Further, the upper limit of the first complex ion concentration of the first solution is, for example, 5% by weight or less, preferably 3% by weight or less, more preferably 2% by weight or less. The first complex ion concentration can be determined by making a calculation from the amounts of the components charged upon preparing the first solution. The concentration of each component in the solution shown below is similarly determined.

(Second Solution)

The second solution (hereinafter, also referred to as "solution B") contains at least potassium ions and hydrogen fluoride, and may contain another component if necessary. The second solution is obtained in the form of, for example, an aqueous solution of hydrofluoric acid containing potassium ions. Specific examples of potassium sources containing potassium ions which can constitute the second solution include water-soluble potassium salts, such as KF, $KHF_2$, KOH, KCl, KBr, KI, $CH_3COOK$ (potassium acetate), and $K_2CO_3$. Of these, preferred is $KHF_2$ because $KHF_2$ can be dissolved without lowering the hydrogen fluoride concentration of the solution, and further has small heat of dissolution and hence achieves high safety.

With respect to the potassium source constituting the second solution, a single type may be used, or two or more types may be used in combination. With respect to the potassium source constituting the second solution, it is preferable substantially not to contain the tetravalent manganese source The lower limit of the hydrogen fluoride concentration of the second solution is, for example, 30% by weight or more, preferably 35% by weight or more, more preferably 40% by weight or more. Further, the upper limit of the hydrogen fluoride concentration of the second solution is, for example, 70% by weight or less, preferably 65% by weight or less, more preferably 60% by weight or less.

The lower limit of the potassium ion concentration of the second solution is, for example, 10% by weight or more, preferably 12.5% by weight or more, more preferably 15% by weight or more. Further, the upper limit of the potassium ion concentration of the second solution is, for example, 35% by weight or less, preferably 32.5% by weight or less, more preferably 30% by weight or less. In a case the potassium ion concentration is 10% by weight or more, it is likely that the yield of the fluoride fluorescent material is improved. On the other hand, when the potassium ion concentration is 35% by weight or less, it is likely that the obtained fluoride fluorescent material has an increased particle diameter.

(Third Solution)

The third solution (hereinafter, also referred to as "solution C") contains at least the second complex ions comprising at least one element selected from the group consisting of elements belonging to Groups 4 and 14 of the Periodic Table, and may contain another component if necessary. The third solution is obtained in the form of, for example, an aqueous solution containing the second complex ions.

The second complex ions preferably comprise at least one element selected from the group consisting of titanium (Ti), zirconium (Zr), hafnium (Hf), silicon (Si), germanium (Ge), and tin (Sn), more preferably comprise silicon (Si), or silicon (Si) and germanium (Ge), further preferably are silicon fluoride complex ions.

For example, when the second complex ions comprise silicon (Si), the second complex ion source is preferably a compound containing silicon and fluorine ions and having excellent solubility in the solution. Specific examples of second complex ion sources include $H_2SiF_6$, $Na_2SiF_6$, $(NH_4)_2SiF_6$, $Rb_2SiF_6$, and $Cs_2SiF_6$. Among these, $H_2SiF_6$ is preferred because $H_2SiF_6$ has high solubility in water and contains no alkali metal element as an impurity.

With respect to the second complex ion source constituting the third solution, a single type may be used, or two or more types may be used in combination.

The lower limit of the second complex ion concentration of the third solution is, for example, 10% by weight or more, preferably 15% by weight or more, more preferably 20% by weight or more. Further, the upper limit of the second complex ion concentration of the third solution is, for example, 60% by weight or less, preferably 55% by weight or less, more preferably 50% by weight or less.

With respect to the method for mixing the first solution, second solution, and third solution, there is no particular limitation, and, while stirring the first solution, the second solution and third solution may be added to the first solution, while stirring the third solution, the first solution and second solution may be added to the third solution, or, while stirring the second solution, the first solution and third solution may be added to the second solution. Alternatively, the first solution, second solution, and third solution may be individually placed in a vessel and mixed with each other by stirring.

Among these, from the viewpoint of efficiently obtaining the fluoride particles, the method for mixing the first solution, second solution and third solution is preferably a method in which, while stirring the first solution, the second solution and third solution are added to the first solution.

With respect to the temperature at which the first solution, second solution, and third solution are mixed together, there is no particular limitation. For example, the solutions can be mixed together at a temperature in the range of from 15 to 40° C., preferably at a temperature in the range of from 23 to 28° C.

Further, with respect to the atmosphere for the mixing, there is no particular limitation. The mixing may be performed in general air or in an atmosphere of an inert gas, such as nitrogen gas.

By mixing together the first solution, second solution and third solution, the first complex ions, potassium ion and the second complex ion react each other in a given ratio to precipitate a crystal of the desired fluoride fluorescent material. The precipitated crystal can be recovered by solid-liquid separation, such as filtration. The fluoride fluorescent material may be washed with a solvent, such as ethanol, isopropyl alcohol, water, or acetone. Further, the fluoride fluorescent material may be subjected to drying treatment. In such a case, the fluoride fluorescent material is dried at, for example, 50° C. or higher, preferably 55° C. or higher, more preferably 60° C. or higher, and at, for example, 110° C. or lower, preferably 100° C. or lower, more preferably 90° C. or lower. With respect to the time for drying, there is no particular limitation as long as the moisture attached to the fluoride fluorescent material can be evaporated, and the drying time is, for example, about 10 hours.

In the mixing of the first solution, second solution and third solution, taking into a consideration a difference caused between the charged composition of the first to third solutions as the above-mentioned raw materials for fluorescent material and the composition of the obtained fluoride fluorescent material, it is preferred that the amounts of the first solution, second solution, and third solution mixed are appropriately controlled so that the composition of the fluoride fluorescent material as a product becomes an intended composition.

<Light Emitting Device>

The light emitting device of the present embodiment comprises a light source that generates light having a wavelength in the range of from 380 to 485 nm, and the fluoride fluorescent material. The light emitting device may further comprise another constituent member if necessary. By virtue of having the fluoride fluorescent material, the light emitting device can achieve excellent long-term reliability. The light emitting device can be preferably applied to a light source for a liquid crystal display apparatus.

(Light Source)

As a light source (hereinafter, also referred to as "excitation light source"), a light source that generates light having a wavelength in the range of from 380 to 485 nm, which is the short wavelength region of visible light, is used. The light source preferably has an emission peak wavelength (maximum emission wavelength) in the wavelength range of from 420 to 485 nm, more preferably in the wavelength range of from 440 to 480 nm. By using such a light source, the fluoride fluorescent material can be efficiently excited, and thus visible light can be effectively utilized. Further, by using an excitation light source having the above-mentioned wavelength range, a light emitting device having high light emission intensity can be provided.

It is preferred that, as the excitation light source, a semiconductor light emitting element (hereinafter, also referred to simply as "light emitting element") is used. By using a semiconductor light emitting element as the excitation light source, there can be obtained a light emitting device which has high efficiency and high linearity of the output with respect to the input and which is resistant to a mechanical impact and stable.

With respect to the light emitting element, one which generates light having a wavelength of a visible light on the short wavelength side can be used. For example, as a blue or green light emitting element, one using a nitride semiconductor ($In_XAl_YGa_{1-X-Y}N$, $0 \leq X$, $0 \leq Y$, $X+Y \leq 1$) can be used.

(Fluoride Fluorescent Material)

The details of the fluoride fluorescent material in the light emitting device are as mentioned above. The fluoride fluorescent material can constitute the light emitting device by, for example, being contained in an encapsulation resin covering the excitation light source. In the light emitting device having the excitation light source covered by an encapsulation resin containing the fluoride fluorescent material, part of the light emitted from the excitation light source is absorbed by the fluoride fluorescent material and emitted as a red light. By using the excitation light source which generates light having the wavelength in the range of from 380 to 485 nm, the emitted light can be more effectively utilized. Thus, a loss of the light emitted from the light emitting device can be reduced, so that the light emitting device having high efficiency can be provided.

With respect to the amount of the fluoride fluorescent material contained in the light emitting device, there is no particular limitation, and the amount of the fluoride fluorescent material can be appropriately selected according to, e.g., the excitation light source.

(Another Fluorescent Material)

It is further preferred that the light emitting device further comprises, in addition to the fluoride fluorescent material, another fluorescent material. Another fluorescent material may be any fluorescent material which absorbs a light from the light source and changes light in wavelength to light having a different wavelength. Another fluorescent material can constitute the light emitting device like the fluoride fluorescent material by, for example, being contained in an encapsulation resin.

Another fluorescent material is preferably at least one element selected from the group consisting of, for example, nitride fluorescent materials, oxide nitride fluorescent materials, and sialon fluorescent materials, each activated mainly by a lanthanoid element, such as Eu or Ce; alkaline earth halogen apatite fluorescent materials, alkaline earth metal halogen borate fluorescent materials, alkaline earth metal aluminate fluorescent materials, alkaline earth silicates, alkaline earth sulfides, alkaline earth thiogallates, alkaline earth silicon nitrides, and germanates, each activated mainly by a lanthanoid element, such as Eu, or a transition metal element, such as Mn; rare earth aluminates and rare earth silicates, each activated mainly by a lanthanoid element, such as Ce; and inorganic and organic complexes each activated mainly by a lanthanoid element, such as Eu.

Specific examples of other fluorescent materials include $(Ca, Sr, Ba)_2SiO_4$:Eu, $(Y, Gd)_3(Ga, Al)_5O_{12}$:Ce, $(Si, Al)_6(O, N)_8$:Eu(β-sialon), $SrGa_2S_4$:Eu, $(Ca, Sr)_2Si_5N_8$:Eu, $CaAlSiN_3$:Eu, $(Ca, Sr)AlSiN_3$:Eu, $Lu_3Al_5O_{12}$:Ce, and $(Ca, Sr, Ba, Zn)_8MgSi_4O_{16}(F, Cl, Br, I)$:Eu.

By using another fluorescent material in the light emitting device, the light emitting device having various color tones can be provided.

When the light emitting device further comprises another fluorescent material, the amount of the fluorescent material contained is not particularly limited, and may be appropriately selected so as to obtain desired light emission properties.

When the light emitting device further comprises another fluorescent material, the light emitting device preferably comprises a green fluorescent material, more preferably a green fluorescent material which absorbs a light in the wavelength range of from 380 to 485 nm to generate light having a wavelength in the range of from 495 to 573 nm. The light emitting device comprising a green fluorescent material can be more preferably applied to a liquid crystal display apparatus.

With respect to the form of the light emitting device, there is no particular limitation, and the form can be appropriately selected from forms generally used. As examples of forms of the light emitting device, there can be mentioned a shell type and a surface mount type. Generally, the shell type indicates a light emitting device having a resin which constitutes the outer surface and which is formed into a shell shape. The surface mount type indicates a light emitting device having a container portion in a depressed form filled with a light emitting element as a light source and a resin. As a further example of the form of the light emitting device, there can be mentioned a light emitting device in which a light emitting element as a light source is mounted on a printed circuit board in a flat plate form, and an encapsulation resin containing the fluoride fluorescent material is formed in a lens shape so as to cover the light emitting element.

Figure 1:
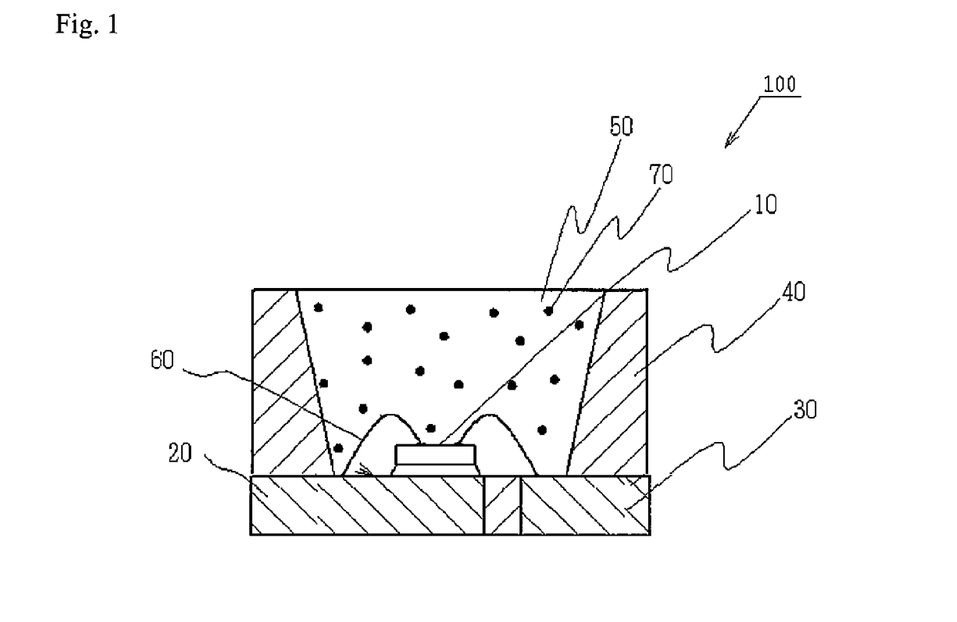
FIG. 1 is a diagrammatic cross-sectional view showing an example of the light emitting device according to the present embodiment.
Figure 2:
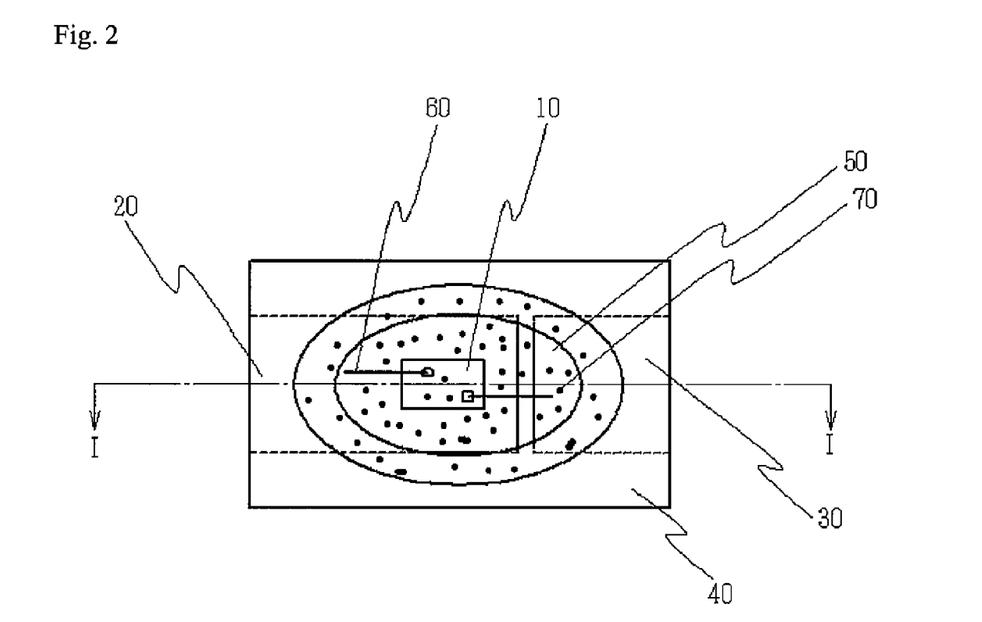
FIG. 2 is a diagrammatic plan view showing an example of the light emitting device according to the present embodiment.

Hereinbelow, an example of the light emitting device according to the present embodiment will be described with reference to the drawings. FIG. 1 is a diagrammatic cross-sectional view showing an example of the light emitting device of the present embodiment. FIG. 2 is a diagrammatic plan view showing an example of the light emitting device of the present embodiment. This light emitting device is an example of a surface mount-type light emitting device.

Light emitting device 100 has light emitting element 10 comprised of a gallium nitride compound semiconductor which generates light having a wavelength of a visible light on the short wavelength side (for example, 380 to 485 nm), and shaped body 40 which has placed thereon light emitting element 10. Shaped body 40 has first lead 20 and second lead 30, and they are integrally molded using a thermoplastic resin or thermosetting resin. Shaped body 40 has formed a depressed portion having a bottom and sides, and has light emitting element 10 placed on the bottom of the depressed portion. Light emitting element 10 has a pair of positive and negative electrodes, and a pair of the positive and negative electrodes are electrically connected to first lead 20 and second lead 30 through wire 60. Light emitting element 10 is encapsulated by encapsulation member 50. As encapsulation member 50, a thermosetting resin, such as an epoxy resin, a silicone resin, an epoxy-modified silicone resin, or a modified silicone resin, is preferably used. Encapsulation member 50 contains fluoride fluorescent material 70 which changes the wavelength of a light from light emitting element 10.

<Image Display Apparatus>

The image display apparatus comprises the at least one light emitting device. With respect to the image display apparatus, there is no particular limitation as long as the apparatus comprises the light emitting device, and the apparatus can be appropriately selected from conventionally known image display apparatuses. The image display apparatus has, for example, in addition to the light emitting device, a color filter member and a light transmission control member.

By virtue of having the light emitting device, the image display apparatus exhibits excellent luminance and color reproduction range as well as excellent long-term reliability.

EXAMPLES

Hereinbelow, the present invention will be described in more detail with reference to the following Examples, which should not be construed as limiting the scope of the present invention.

Example 1

16.25 g of $K_2MnF_6$ was weighed, and dissolved in 1,000 g of a 55% by weight aqueous HF solution to prepare solution A. Separately, 195.10 g of $KHF_2$ was weighed, and dissolved in 200 g of a 55% by weight aqueous HF solution to prepare solution B. 450 g of a 40% by weight aqueous $H_2SiF_6$ solution was weighed and used as solution C.

Then, while stirring solution A at room temperature, solution B and solution C were individually added dropwise to solution A over about 20 minutes. The resultant deposits were recovered by solid-liquid separation, and then washed with IPA (isopropyl alcohol), and dried at 70° C. for 10 hours to prepare a fluoride fluorescent material in Example 1.

Examples 2 and 3

Fluoride fluorescent materials in Examples 2 and 3 were individually prepared by substantially the same method as in Example 1 except that the charged composition and charged amounts were changed to those shown in Table 1.

Comparative Example 1

16.25 g of $K_2MnF_6$ was weighed, and dissolved in 1,000 g of a 55% by weight aqueous HF solution, and then 450 g of a 40% by weight aqueous $H_2SiF_6$ solution was added thereto to prepare solution A'. 195.10 g of $KHF_2$ was weighed, and dissolved in 200 g of a 55% by weight aqueous HF solution to prepare solution B.

Then, while stirring solution A' at room temperature, solution B was added dropwise to solution A' over about 20 minutes. The resultant deposits were recovered by solid-liquid separation, and then washed with IPA, and dried at 70° C. for 10 hours to prepare a fluoride fluorescent material in Comparative Example 1.

TABLE 1

| | Charged composition (mol) | | | | | Solution A (g) | | Solution B (g) | | Solution C (g) | Solution A' (g) | | |
| | K | Si | Mn | F | K$_2$MnF$_6$ | 55% aqueous HF solution | KHF$_2$ | 55% aqueous HF solution | 40% aqueous H$_2$SiF$_6$ solution | K$_2$MnF$_6$ | 55% aqueous HF solution | 40% aqueous H$_2$SiF$_6$ solution |
|---|---|---|---|---|---|---|---|---|---|---|---|---|
| Example 1 | 2 | 0.95 | 0.05 | 6 | 16.25 | 1000 | 195.10 | 200 | 450 | — | — | — |
| Example 2 | 2 | 0.95 | 0.05 | 6 | 16.25 | 1000 | 195.10 | 160 | 450 | — | — | — |
| Example 3 | 2 | 0.95 | 0.05 | 6 | 16.25 | 1000 | 195.10 | 240 | 450 | — | — | — |
| Comparative example 1 | 2 | 0.95 | 0.05 | 6 | — | — | 195.10 | 200 | — | 16.25 | 1000 | 450 |

With respect to each of the above-obtained fluoride fluorescent materials, the emission luminance characteristics and powder characteristics are shown in Table 2. The emission luminance characteristics were measured under conditions at an excitation wavelength of 460 nm for a reflective luminance. With respect to the powder characteristics, a weight median diameter (Dm) was measured using a laser diffraction-type particle size distribution measurement apparatus (MASTER SIZER 2000, manufactured by Malvern Instruments Ltd.), an average particle diameter (F.S.S.S.) as measured by a Fischer method was measured using Fisher Sub-Sieve Sizer Model 95 (manufactured by Fisher Scientific Inc.), and a bulk density was measured using a measuring cylinder.

in Examples 2 and 3. A semiconductor light emitting element having a main wavelength of 451 to 452 nm was encapsulated with an encapsulation material having the fluoride fluorescent material and a green fluorescent material dispersed in a silicone resin to prepare a light emitting device.

The combinations of the fluorescent materials and the properties of the light emitting devices in Examples 4 to 7 are shown in Table 3. The properties of the light emitting devices were measured by a method generally used.

Further, in Table 3, the β sialon is a green fluorescent material represented by the compositional formula: (Si, Al)$_6$(O, N)$_8$:Eu, and the chlorosilicate is a green fluorescent material represented by the compositional formula: (Ca, Sr, Ba, Zn)$_8$MgSi$_4$O$_{16}$(F, Cl, Br, I):Eu.

TABLE 3

| | Fluorescent material | | Properties of light emitting device | | | Composition of encapsulating material (g) | | |
| | Green fluorescent material | Red fluorescent material | x | y | φv (calc.) | Resin | Green fluorescent material | Red fluorescent material |
|---|---|---|---|---|---|---|---|---|
| Example 4 | Lu$_3$Al$_5$O$_{12}$:Ce | Example 3 | 0.267 | 0.262 | 100% | 100 | 23 | 41 |
| Example 5 | Lu$_3$Al$_5$O$_{12}$:Ce | Example 2 | 0.277 | 0.264 | 96% | 100 | 20 | 25 |
| Example 6 | β sialon | Example 3 | 0.253 | 0.254 | 92% | 100 | 35 | 65 |
| Example 7 | chlorosilicate | Example 3 | 0.266 | 0.250 | 88% | 100 | 12 | 104 |

TABLE 2

| | F.S.S.S. (μm) | Dm (μm) | Bulk density (g·cm$^{-3}$) | Chromaticity coordinates | | Relative luminance (%) |
| | | | | x | y | |
|---|---|---|---|---|---|---|
| Example 1 | 32.0 | 41.2 | 1.03 | 0.678 | 0.312 | 124 |
| Example 2 | 24.5 | 35.4 | 1.05 | 0.678 | 0.312 | 116 |
| Example 3 | 46.5 | 56.8 | 1.19 | 0.679 | 0.312 | 128 |
| Comparative example 1 | 17.0 | 28.5 | 0.61 | 0.678 | 0.313 | 100 |

Examples 4 to 7

Light emitting devices were individually prepared using the fluoride fluorescent materials (red fluorescent materials)

The fluoride fluorescent material of the present embodiment and the light emitting device using the same can be used in, for example, a fluorescent character display tube, a display, a PDP, a CRT, an FL, an FED, and a projector tube, particularly, in a backlight light source using a blue light emitting diode as a light source and having extremely excellent light emission properties, an LED display, a light source for white lighting, a signal, a light switch, and various types of sensors and indicators, and especially in the use of display, they exhibit excellent light emission properties.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

All publications, patent applications, and technical standards mentioned in this specification are herein incorporated by reference to the same extent as if each individual publication, patent application, or technical standard was specifically and individually indicated to be incorporated by reference.

What is claimed is:

1. A fluoride fluorescent material comprising a chemical composition represented by the following formula (I):

$$K_2[M_{1-a}Mn^{4+}{}_aF_6] \quad (I)$$

wherein
M is at least one element selected from the group consisting of elements belonging to Groups 4 and 14 of the Periodic Table, and a is a value that satisfies the relationship: 0<a<0.2,
and
a minimum value of a weight median diameter of the fluoride fluorescent material is greater than or equal to 30 μm.

2. The fluoride fluorescent material according to claim 1, wherein M is at least one element selected from the group consisting of titanium (Ti), zirconium (Zr), hafnium (Hf), silicon (Si), germanium (Ge), and tin (Sn).

3. The fluoride fluorescent material according to claim 2, wherein the maximum value of the weight median diameter is 100 μm.

4. The fluoride fluorescent material according to claim 3, wherein the fluoride fluorescent material has a bulk density of 0.80 g/cm³ or more.

5. The fluoride fluorescent material according to claim 1, wherein a maximum value of the weight median diameter is 100 μm.

6. The fluoride fluorescent material according to claim 1, wherein the fluoride fluorescent material has a bulk density of 0.80 g/cm³ or more.

7. The fluoride fluorescent material according to claim 1, wherein the fluoride fluorescent material has the minimum value of the weight median diameter is 50 μm.

8. A light emitting device comprising:
a light source that generates light having a wavelength in the range of from 380 to 485 nm; and
the fluoride fluorescent material according to claim 1.

9. The light emitting device according to claim 8, further comprising a green fluorescent material that absorbs light having the wavelength in the range of from 380 to 485 nm to generate light having a wavelength in the range of from 495 to 573 nm.

10. The light emitting device according to claim 9, wherein the green fluorescent material is β sialon represented by the formula (Si, Al)$_6$(O, N)$_8$:Eu or a chlorosilicate represented by the formula (Ca, Sr, Ba, Zn)$_8$MgSi$_4$O$_{16}$(F, Cl, Br, I):Eu.

11. A light source for a liquid crystal display apparatus comprising the light emitting device according to claim 8.

12. An image display apparatus comprising the light emitting device according to claim 8.

13. The fluoride fluorescent material according to claim 1, wherein the minimum value of a weight median diameter of the fluoride fluorescent material is 35 μm.

14. The fluoride fluorescent material according to claim 1, wherein the minimum value of a weight median diameter off the fluoride fluorescent material is 40 μm.

15. The fluoride fluorescent material according to claim 1, wherein M is silicon (Si), or silicon (Si) and germanium (Ge).

16. A fluoride fluorescent material having a chemical composition represented by the following formula (I):

$$K_2[M_{1-a}Mn^{4+}{}_aF_6] \quad (I)$$

wherein
M is at least one element selected from the group consisting of elements belonging to Groups 4 and 14 of the Periodic Table, and a is a value that satisfies the relationship: 0<a<0.2,
and
the fluoride fluorescent material has a bulk density of 0.80 g/cm³ or more.

17. The fluoride fluorescent material according to claim 16, wherein M is at least one element selected from the group consisting of titanium (Ti), zirconium (Zr), hafnium (Hf), silicon (Si), germanium (Ge), and tin (Sn).

18. The fluoride fluorescent material according to claim 17, wherein the bulk density is 1.00 g/cm³ or more.

19. The fluoride fluorescent material according to claim 16, wherein the bulk density is 1.00 g/cm³ or more.

20. A light emitting device comprising:
a light source that generates light having a wavelength in the range of from 380 to 485 nm; and
the fluoride fluorescent material according to claim 16.

21. An image display apparatus comprising the light emitting device according to claim 20.

* * * * *

UNITED STATES PATENT AND TRADEMARK OFFICE
CERTIFICATE OF CORRECTION

PATENT NO. : 9,564,558 B2
APPLICATION NO. : 14/446600
DATED : February 7, 2017
INVENTOR(S) : Tomokazu Yoshida et al.

It is certified that error appears in the above-identified patent and that said Letters Patent is hereby corrected as shown below:

In the Claims

At Column 16, Line 18, change "diameter off the fluoride" to -- diameter of the fluoride --.

Signed and Sealed this
Nineteenth Day of December, 2017

Joseph Matal
*Performing the Functions and Duties of the
Under Secretary of Commerce for Intellectual Property and
Director of the United States Patent and Trademark Office*